(12) United States Patent
Wiest et al.

(10) Patent No.: US 8,435,063 B2
(45) Date of Patent: May 7, 2013

(54) ELECTRICAL CONNECTOR ASSEMBLY

(75) Inventors: Shane Wiest, Shermans Dale, PA (US); Gottlieb Oyster, Hummelstown, PA (US); Kevin Walker, Hershey, PA (US); John Phillip Huss, Jr., Harrisburg, PA (US); Arndt Schafmeister, Dörentrup (DE); Sebastian Schafer, Blomberg (DE)

(73) Assignee: Phoenix Contact Development & Manufacturing, Inc., Middletown, PA (US)

(*) Notice: Subject to any disclaimer, the term of this patent is extended or adjusted under 35 U.S.C. 154(b) by 0 days.

(21) Appl. No.: 13/311,690

(22) Filed: Dec. 6, 2011

(65) Prior Publication Data
US 2012/0315783 A1 Dec. 13, 2012

Related U.S. Application Data

(60) Provisional application No. 61/494,004, filed on Jun. 7, 2011.

(51) Int. Cl.
*H01R 13/62* (2006.01)
(52) U.S. Cl.
USPC .......................................................... 439/354
(58) Field of Classification Search .................. 439/354, 439/353, 357
See application file for complete search history.

(56) References Cited

U.S. PATENT DOCUMENTS

| | | | |
|---|---|---|---|
| 3,841,888 A * | 10/1974 | Belde et al. | 106/173.01 |
| 4,113,179 A * | 9/1978 | McKee | 439/354 |
| 4,924,561 A | 5/1990 | Yoneyama | |
| 5,342,215 A | 8/1994 | Silbernagel et al. | |
| 5,785,546 A * | 7/1998 | Hamai et al. | 439/354 |
| 5,876,246 A | 3/1999 | Martin et al. | |
| 5,921,800 A * | 7/1999 | Liebich | 439/354 |
| 6,019,629 A * | 2/2000 | Ito et al. | 439/489 |
| 6,540,543 B1* | 4/2003 | Watanabe | 439/354 |
| 6,752,642 B2 | 6/2004 | Ushiro et al. | |
| 6,814,605 B2 | 11/2004 | Masumoto | |
| 7,229,306 B2* | 6/2007 | Mase et al. | 439/354 |
| 7,422,466 B1 | 9/2008 | Arai | |
| 7,850,476 B2 | 12/2010 | Good | |
| 2009/0318004 A1 | 12/2009 | Cours | |

FOREIGN PATENT DOCUMENTS
DE 202010005085 12/2010

* cited by examiner

*Primary Examiner* — Gary F. Paumen
(74) *Attorney, Agent, or Firm* — Hooker & Habib, P.C.

(57) ABSTRACT

An electrical connector assembly for forming AC power connections between a DC-to-AC inverter on a solar panel and AC power cable extending to an AC power grid includes a three-contact socket on the inverter and a three-contact electrical connector on the cable. The connector may be joined to the socket in either of two positions.

16 Claims, 17 Drawing Sheets

ELECTRICAL CONNECTOR ASSEMBLY

FIELD OF THE INVENTION

The disclosure relates to electrical connector assemblies. A disclosed embodiment may be used as an electrical connector assembly for forming AC power connections between a DC-to-AC inverter on a solar panel and an AC power cable extending to an AC power grid.

BACKGROUND OF THE DISCLOSURE

Photovoltaic solar panels generate electrical power. Large numbers of panels are arranged in fields or arrays. A power cable connects the outputs of the panels to a power grid.

Solar panels generate DC electrical power. A DC-to-AC inverter is mounted on each panel to convert the DC power output to alternating current. An electrical connector assembly forms three electrical connections between AC output contacts in the inverter and the wires of a three-wire AC power cable connected to the power grid.

The assembly includes a low-profile cable electrical connector which removably engages a connector socket on the inverter. The cable connector includes an interior module forming electrical connections with the three wires in the cable and connecting the wires to three spaced contact pins extending along one side of the cable connector in three contact barrels spaced along the cable. The contact barrels surround the contact pins and are extended into three spaced recesses in the inverter with the contact pins engaging output terminals in the inverter. Low level latches on either end of the cable connector extend into latch recesses in the inverter in either end of a connector socket to form removable latch connections holding the cable connector on the socket. The latch members are located below the barrels to reduce the height of the cable connector.

The latch members are integrally molded in the cable connector and include rigid x-shaped supports and reverse-bend latch arms which engage latch surfaces on the socket. A rib on each support prevents over-flexing of the support latch arm.

The cable connector includes an integral lead assembly with metal leads attached to the cable wires and extending across the wires to the contact pins. The power transmitting wires in the cable extend along the length of the cable and are not deformed laterally to form connections with the contact pins spaced along the length of the cable connector.

The three pin contacts on the cable connector are spaced along the length of the cable and may be joined to the connector socket on the inverter in either of two positions, in order to facilitate routing of the cable according to the locations of the inverters.

DESCRIPTION OF THE PREFERRED EMBODIMENT

Figure 1:
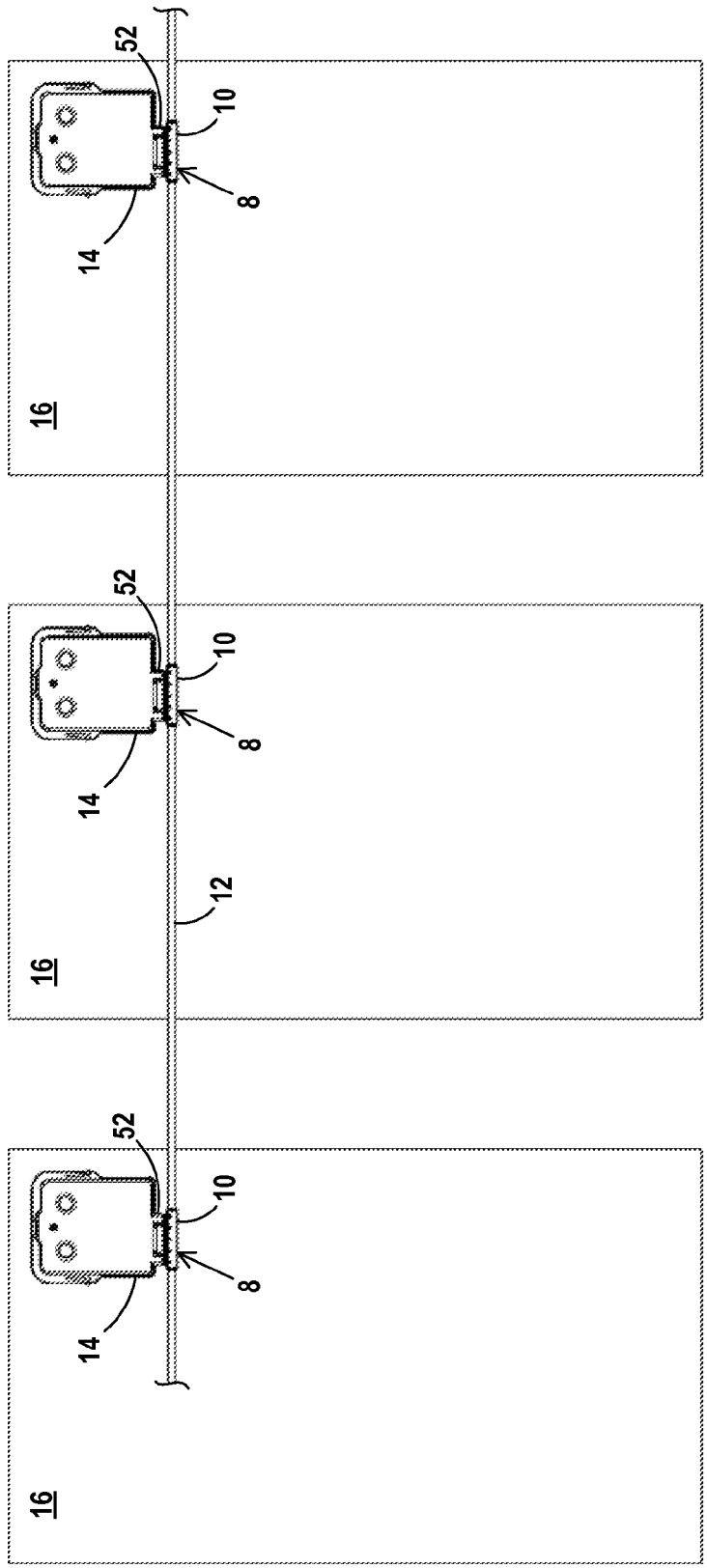
FIG. 1 illustrates a number of solar panels in an array of panels with DC-to-AC inverters on the panels connected to an AC power cable.

Electrical connector assemblies 8 are spaced along three-wire AC power cable 12 shown in FIG. 1. The cable transmits AC current generated by photovoltaic solar panels 16 to an AC power grid. Each assembly 8 includes an electrical connector 10 on cable 12 and a connector socket, sometimes also referred to as an electrical connector, 52 forming part of an AC-to-DC inverter 14. Inverters 14 are mounted on panels 16. Each assembly 8 forms an electrical connection between output contacts of the inverter 14 mounted on the solar panel 16 and three wires in the cable. The output contacts are housed in connector socket 52 on the inverter. DC power generated by panels 16 is converted to three-phase AC power by inverters 14, and flows from sockets 52 in connectors 10 to the wires in cable 12 and through the cable to a distribution point on a power grid.

Cable connector 10 includes an elongate, hollow plastic body or housing 18 having an open back and cover 20 closing the open back of the housing. Housing 18 has a flat front face 22 away from cover 20. Rectangular projection 24 extends out from face 22 to forward surface 26. Three hollow contact barrels 28 extend outwardly from and are spaced along the length of forward surface 26. A three-rib resilient sealing gasket 30 surrounds each barrel 28.

Projection 24 is located on the center of face 22. One-piece plastic latch members 32 extend out from face 22 to either side of projection 24 end walls 40. Each latch member 32 includes an x-shaped arm support 34 extending outwardly from face 22 to a rounded end 36 and a straight and flexible latch arm 38. The arm 38 extends inwardly from end 36 at an angle toward face 22 and adjacent wall 40. Latch surface 42 is located on the inner, free end of arm 38 adjacent face 22. Latch members 32 are integrally molded parts of plastic housing 18.

Support 34 includes flat rib 46 extending from face 22 to end 36. Rib 46 is the same width as arm 38 and parallels wall 40. Perpendicular rib 48 extends from face 22 to end 36 at the center of rib 46 on the side of the rib 46 away from arm 38. Rib 48 has an inwardly sloped guide surface 44. Narrow perpendicular rib 50 extends from face 22 approximately half way to end 36 at the center of rib 46 on the side of the rib facing arm 38. Ribs 46, 48 and 50 form a strong, cross-shaped support for arm 38. Rib 50 permits limited inward flexing of arm 38 during latching engagement of connector 10 with socket 52 on inverter 14 and during unlatching. Rib 50 prevents overflexing and injury to arm 38.

Figure 4:
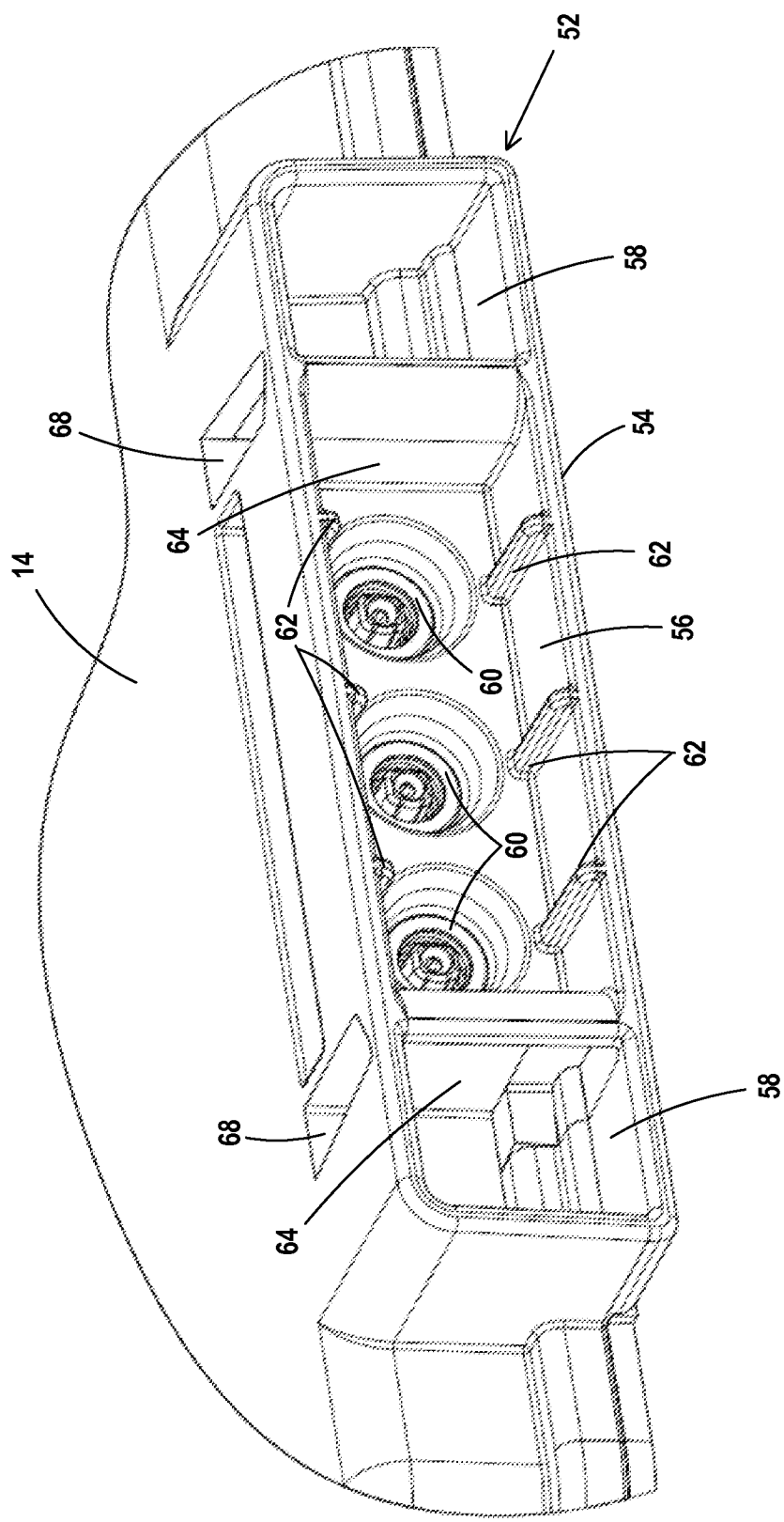
FIG. 4 is a perspective view of a connector socket on an inverter.

As shown in FIG. 4, connector socket 52 is part of inverter and has an elongate, rectangular plastic body 54 with an elongate, rectangular central recess 56 and like end latch recesses 58. Three cylindrical openings 60 open into the bottom of recess 56 to receive contact barrels 28 when connector 10 and socket 52 are engaged. Guide ribs 62 on the interior walls of central recess 56 to either side of each opening 60 guide the barrels into the openings.

Figure 6:
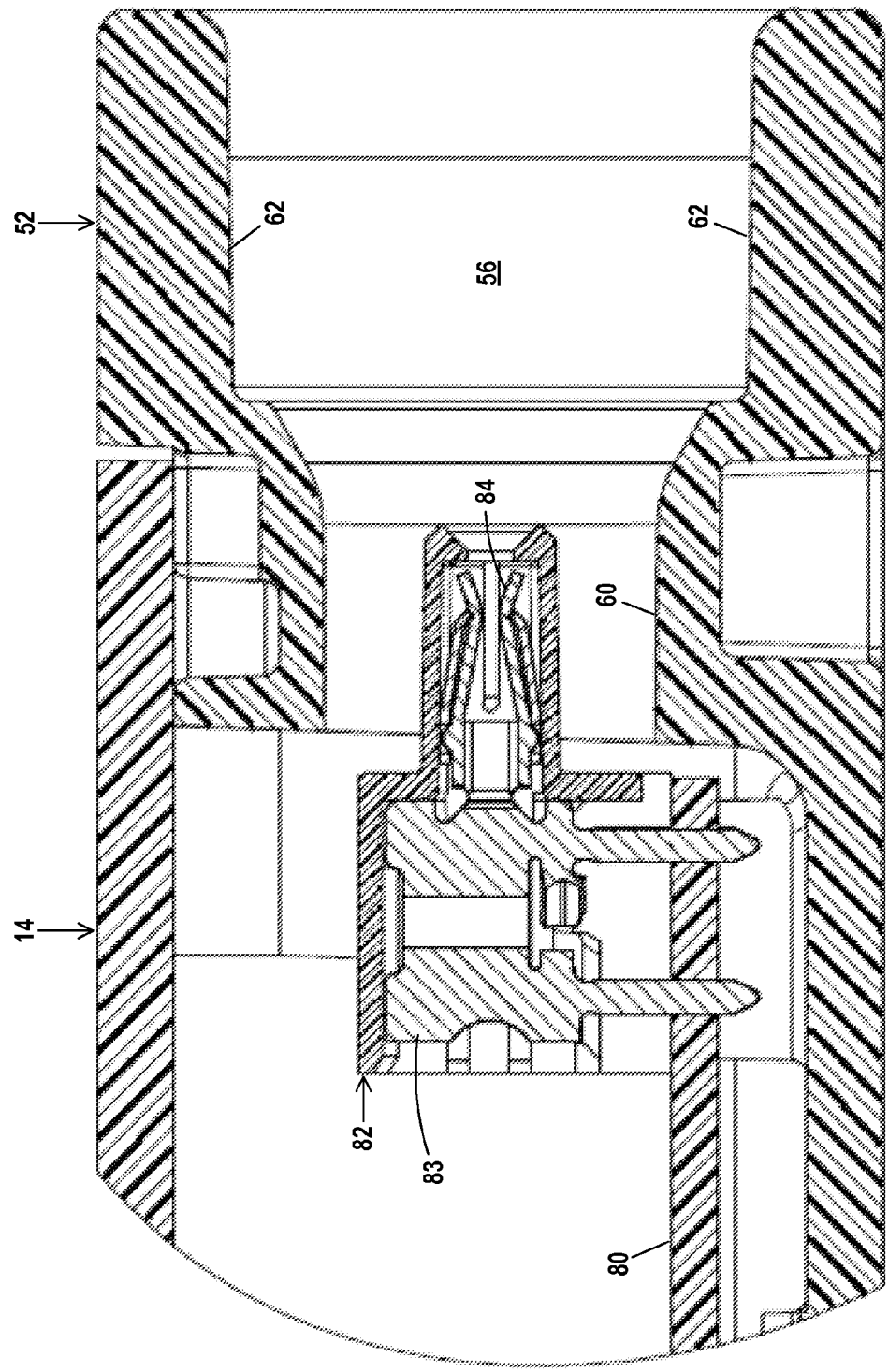
FIG. 6 is a vertical sectional view taken through the connector socket.
Figure 8:
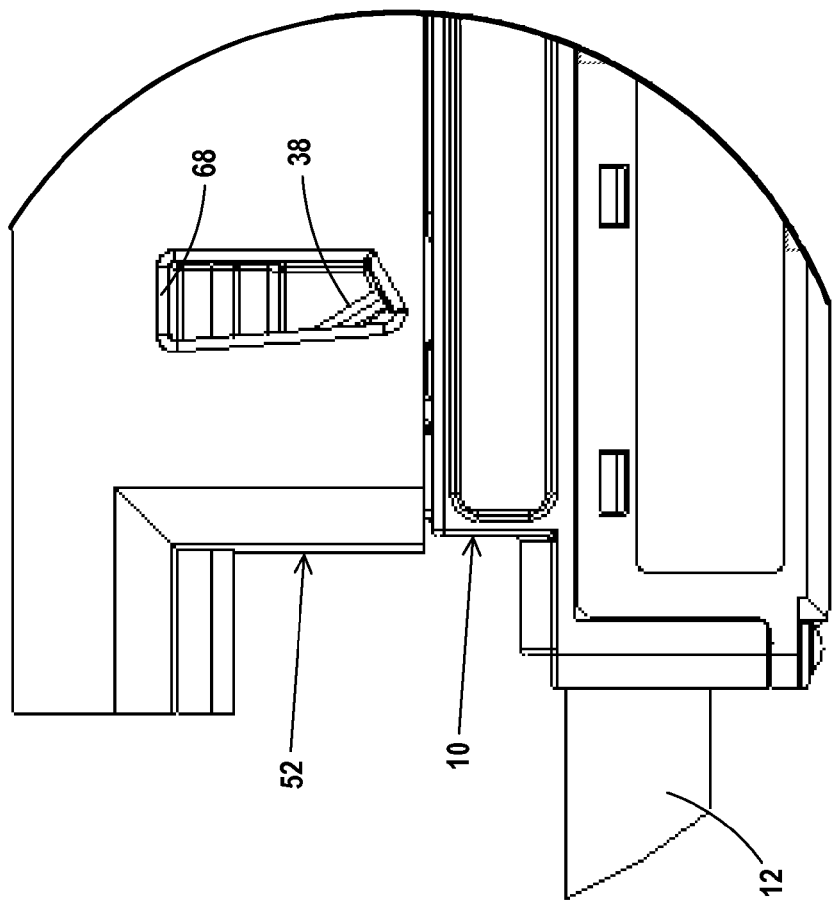
FIG. 8 is a top view of the electrical connector assembly, partially broken away.

As illustrated in FIG. 6, inverter 14 includes an internal circuit board 80. Right-angle header 82 is mounted on the edge of circuit board 80 at socket 52. Three right-angle contacts 83 in header 82 are connected to power output leads on board 80 and have output contacts 84 for engaging contact pins on assembly 8. Each contact 84 is located centrally in an opening 60.

Figure 7:
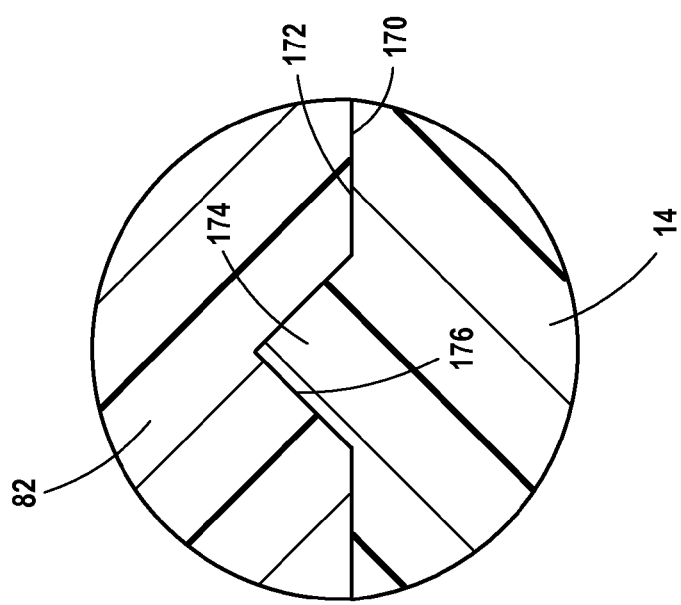
FIG. 7 is a horizontal sectional view taken through an interface between a right-angle header and the inverter body.

FIG. 7 is a horizontal sectional view through an interface between vertical front surface 170 of right-angle header 82 and a vertical inner surface 172 on the inverter body at socket 52. Vertical triangular rib 174 on the inverter body extends inwardly of surface 172 and fits snuggly into vertical groove 176 in header 82.

During assembly of socket 52, the right-angle header is rigidly mounted on circuit board 80, and the header and board are loosely positioned in the interior of inverter 14. Surface 170 on the header is then brought into engagement with inverter surface 172 with rib 174 fitted in groove 176. The engagement between the rib and groove laterally positions the header on the connector socket so that output contacts 84 are properly located in the centers of openings 60, in position to engage the pin contacts when cable connector 10 is inserted into the inverter. After the right-angle header is properly positioned laterally in the connector socket, circuit board 80 is secured to the inverter body, typically by screw fasteners, to maintain proper positioning of the board and right-angle header. The rib and groove are located between two barrels 28.

Figure 9:
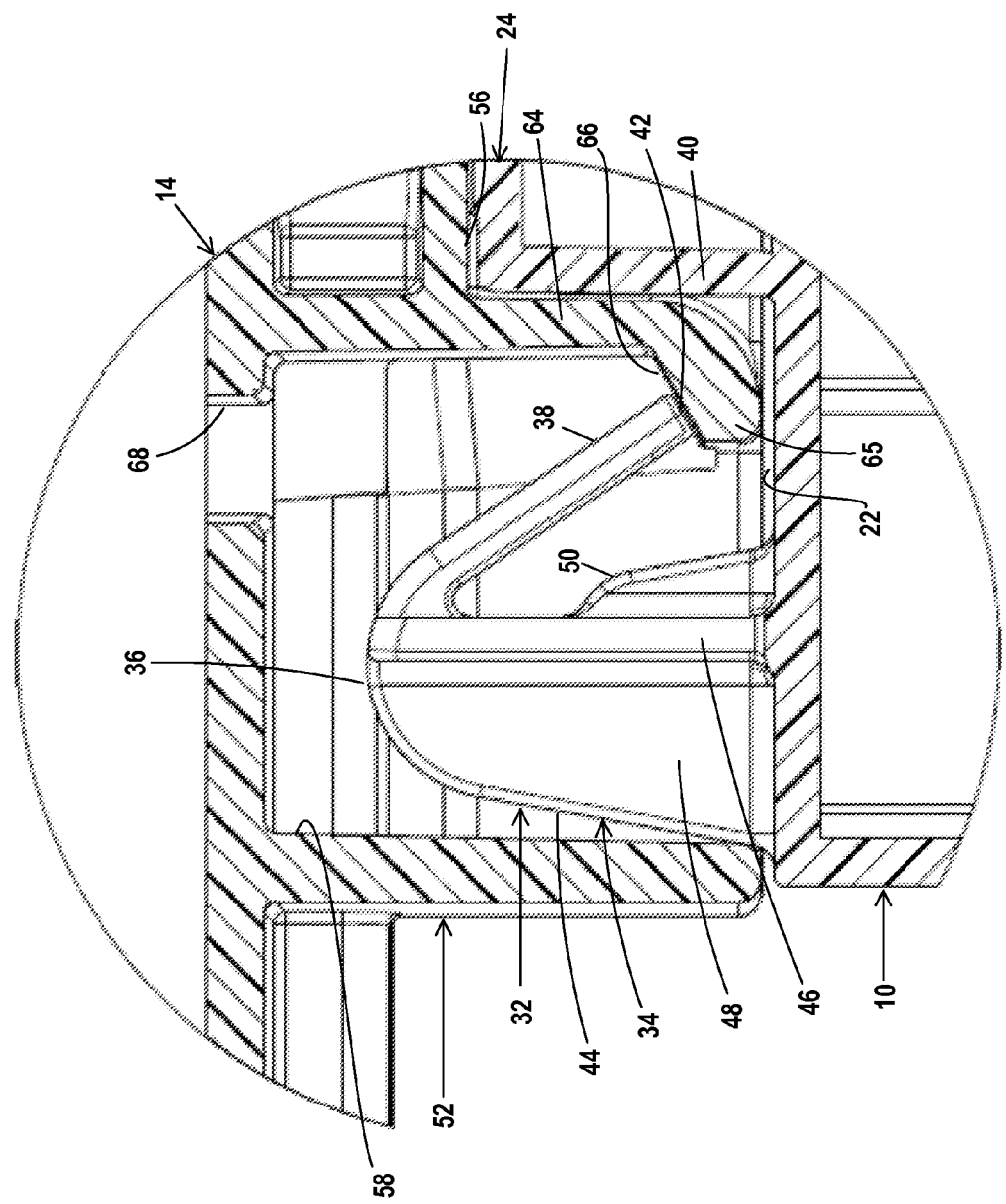
FIG. 9 is a horizontal sectional view through the assembly illustrating latched engagement of the socket and cable connector.

As shown in FIG. 9, latch recesses 58 extend deeper into socket 52 than central recess 56 in order to accommodate latch members 32. The latch members 32 extend outwardly from face 22 further than the height of projection 24. Location of latch member 32 on face 22 below forward surface 26 locates the ends of barrels 28 and latch members 32 at about the same distance above face 22. The latch members 32 have a height sufficient to permit flexing of arms 38. The increased height of the latch members 32 permitted by recessed face 22 increases the length and flexibility of arms 38 and reduces the depth of recesses 58.

Walls 64 separate central recess 56 from latch recesses 58. The outer ends of walls 64 include angled projections 65 and stop surfaces 66 extending into recesses 58 to engage latch surfaces 42 on the ends of arms 38 when connector 10 is mounted on socket 52. Latch surfaces 42 and stop surfaces 66 are perpendicular to the length of arms 38 to limit lateral movement of the arms when a withdrawal force is applied to latched connector 10. FIGS. 4, 7 and 9 illustrate latch release openings 68 formed in the top wall of socket 52. Openings 68 are over latch arms 38 when the connector 10 and socket 52 are engaged.

Figure 2:
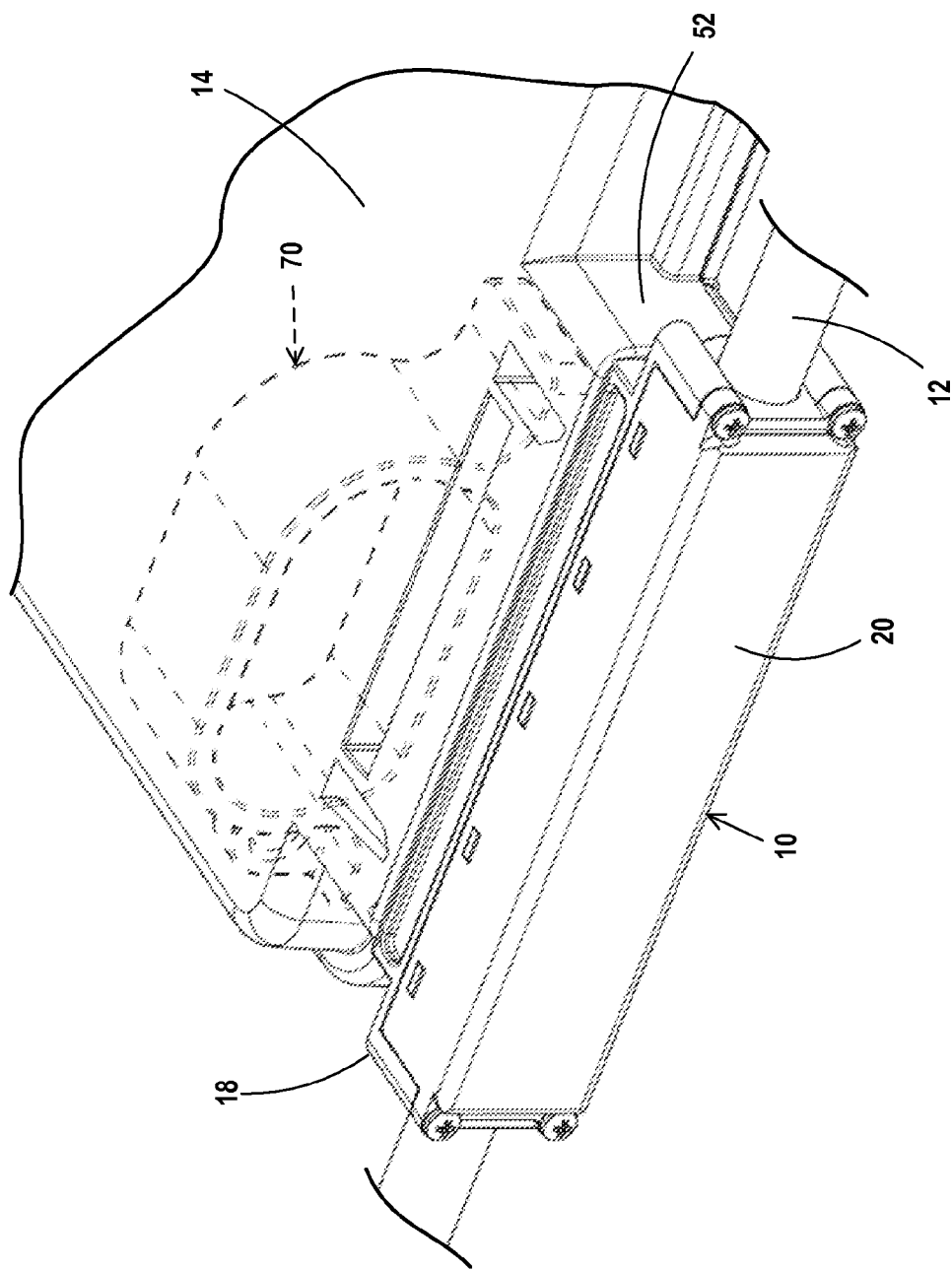
FIG. 2 is a perspective view of an electrical connector assembly and a release tool.
Figure 5:
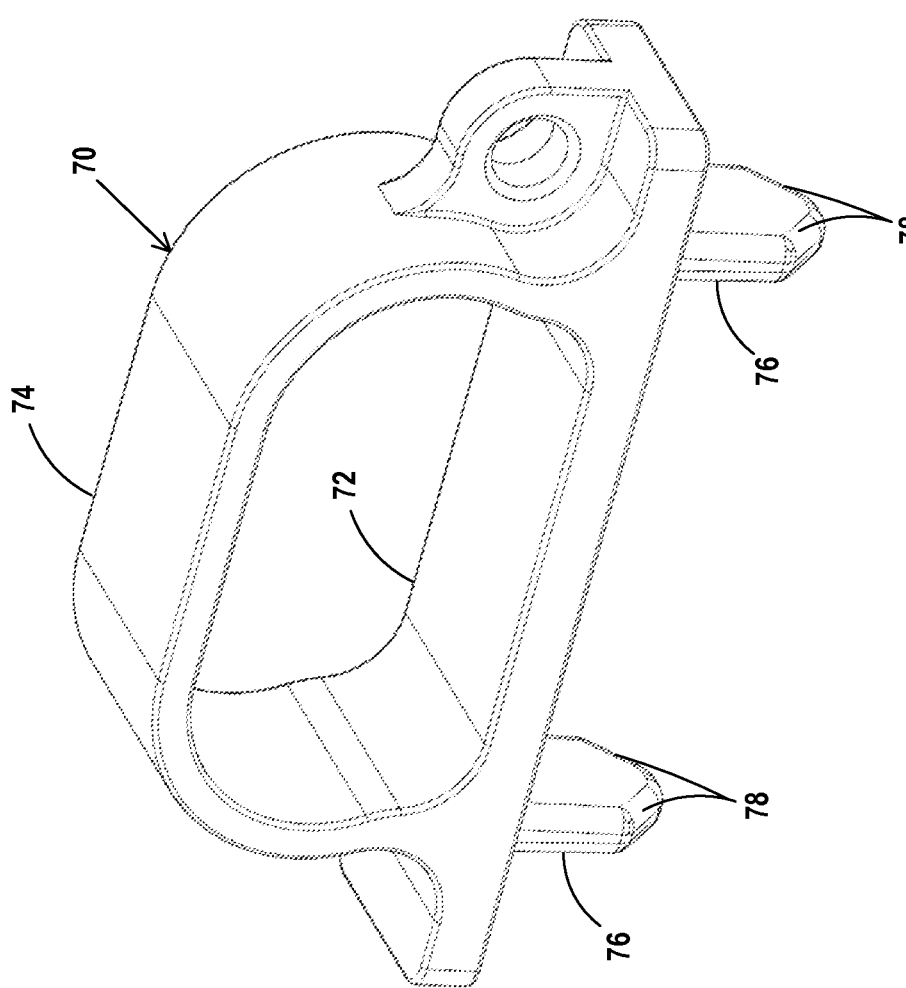
FIG. 5 is a perspective view of the release tool.

Latch release tool 70, shown in FIGS. 2 and 5, includes a base 72, handle 74 above the base, and two spaced cam release fingers 76 extending down from opposed ends of base 72. The fingers each have two spaced, rounded engagement surfaces 78 facing the opposed sides of base 72. The fingers extend through release openings 68 in the top of socket 52 when tool 70 is positioned over the socket 52 and lowered, as shown in FIG. 2. The surfaces 78 on one side of tool 70 engage the outer ends of latch arms 38 and flex the latch arms toward latch members 32 and out of engagement with stop surfaces 66. The rounded surfaces 78 smoothly cam the arms 38 out of engagement with surfaces 66 without injury to the arms. The two surfaces 78 on each finger 76 permit the tool to be inserted in the socket in either of two orientations to unlatch connector 10.

During insertion of fingers 76 into openings 68 to release arms 38 from the latched positions, the fingers 76 slide along walls 64 and are supported by the walls against deflection during outward camming of arms 38.

Figure 10:
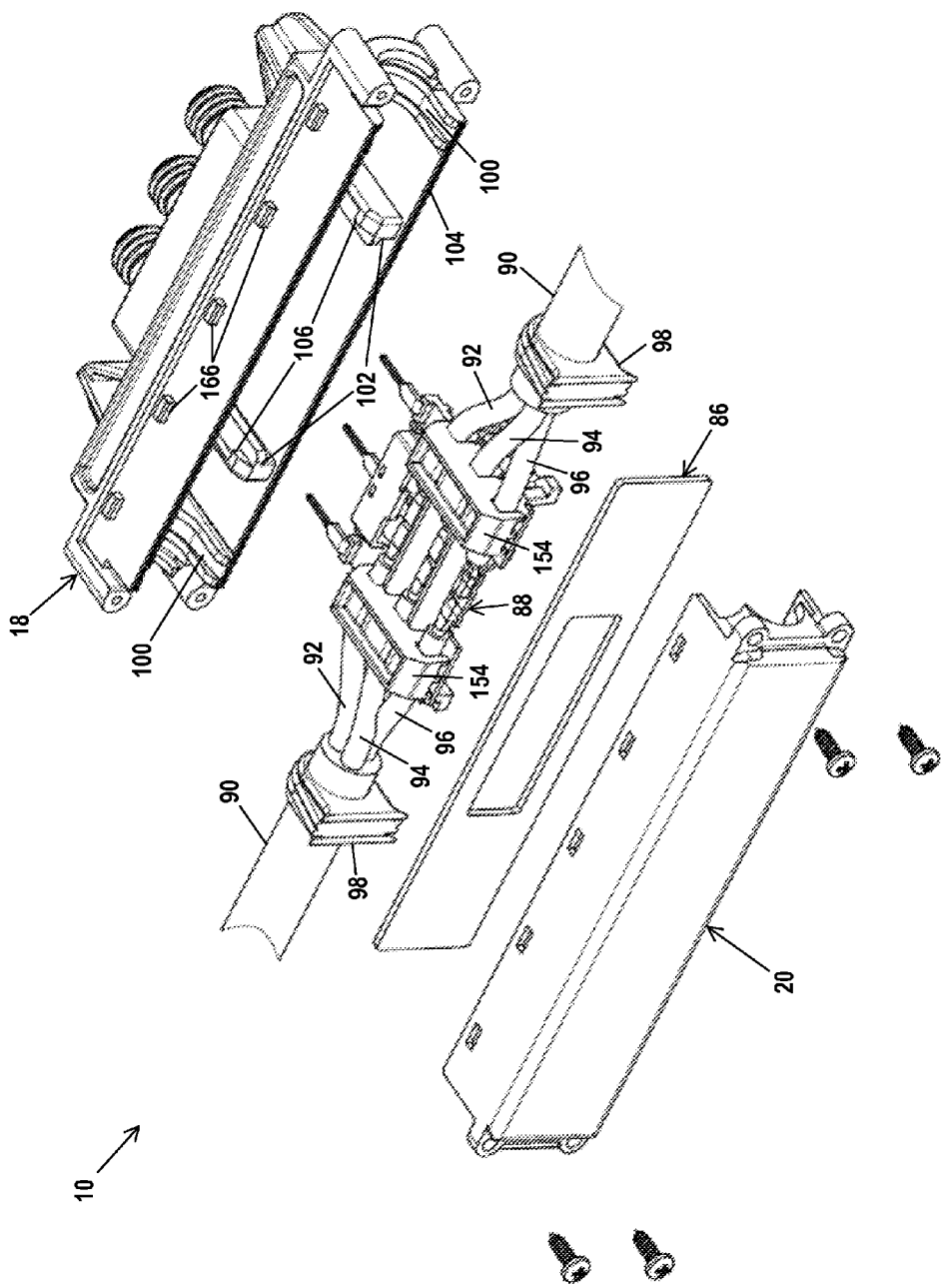
FIG. 10 is an exploded view of the cable connector.

As illustrated in FIG. 10, electrical connector 10 includes plastic housing 18, cover 20 which closes an opening at the back of the housing, and a sealing gasket 86 for mounting between the cover and the housing and lead assembly 88 latched in the interior of the housing. End sections 90 of cable 12 are connected to assembly 88. Each section 90 includes three insulated power wires 92, 94 and 96. Cable seals 98 are mounted on sections 90 adjacent assembly 88 and are fitted into recesses 100 at the ends of the housing. Spaced alignment grooves 102 extend in along the inner surface of lower wall 104 of the housing. Latch stops 106 overlie grooves 102.

Figure 11:
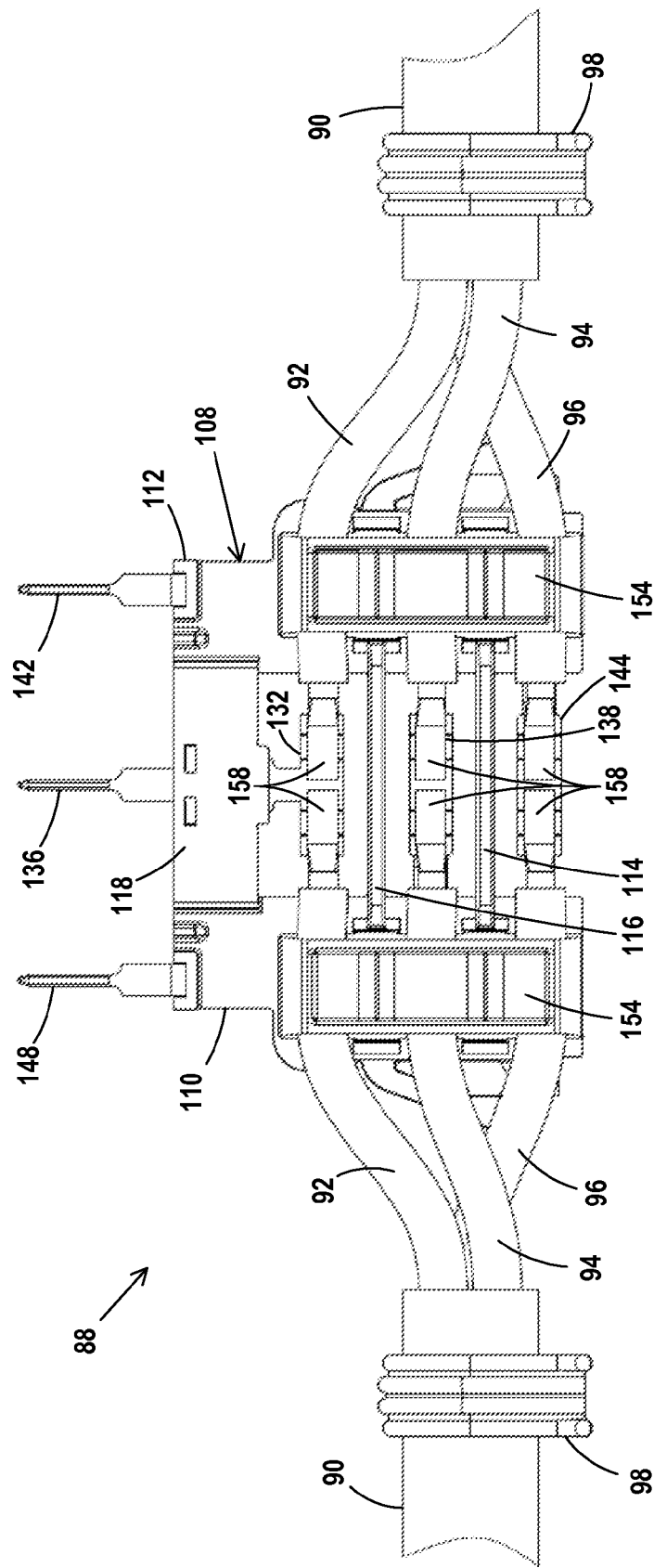
FIG. 11 is a top view of a lead frame assembly on the power cable.
Figure 12:
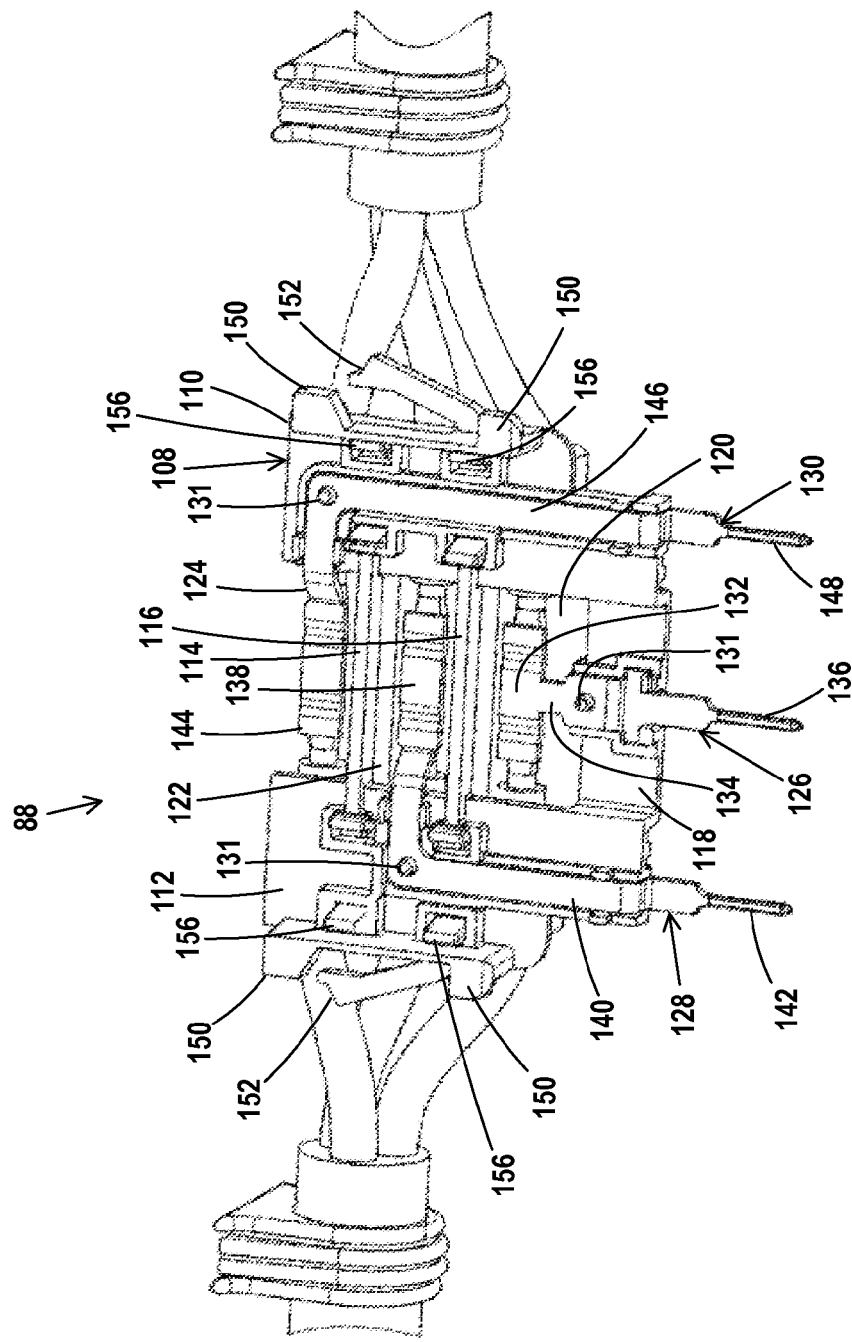
FIG. 12 is a bottom view of the lead frame assembly on the power cable.
Figure 13:
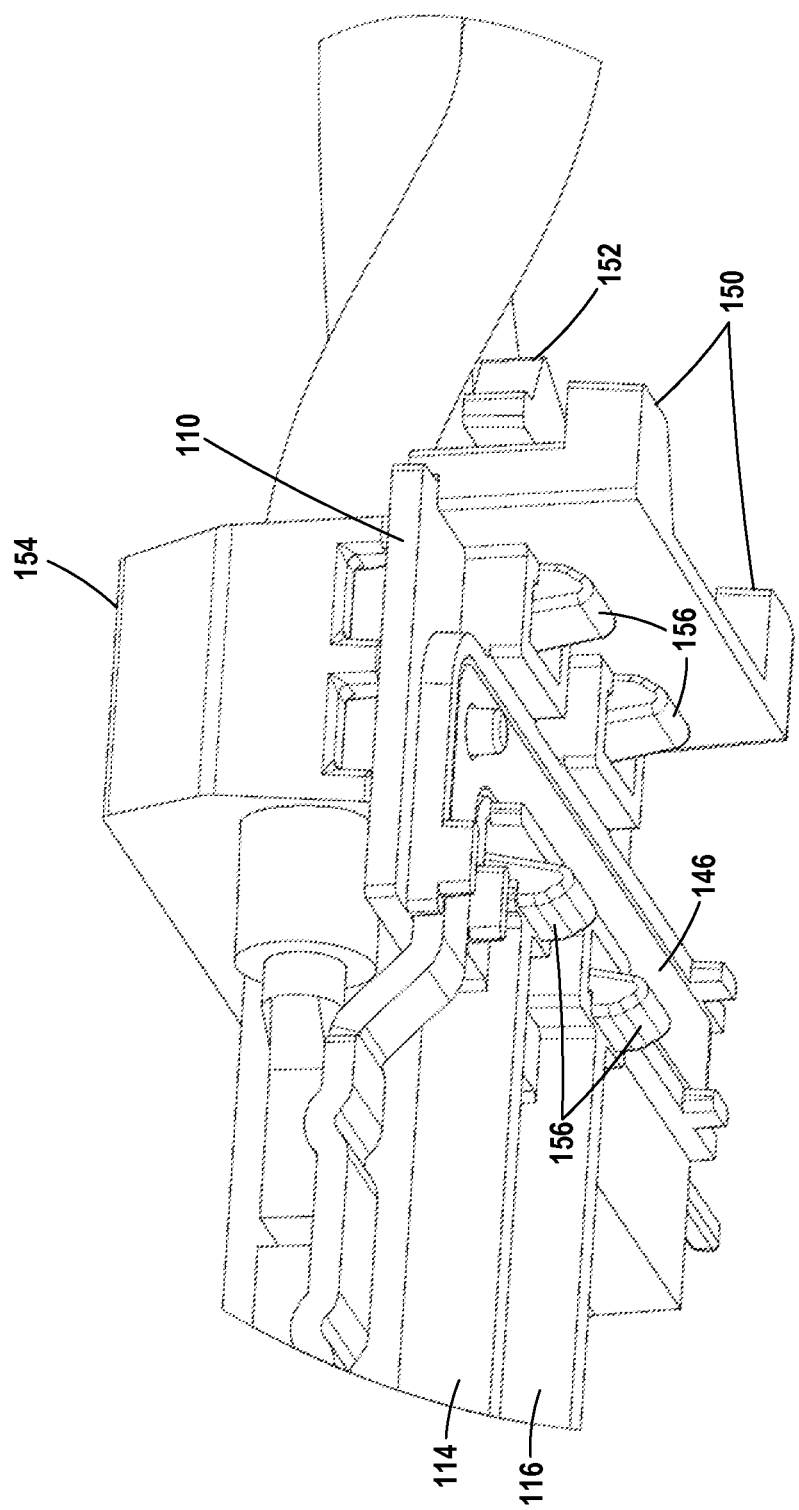
FIG. 13 is a partial bottom perspective view of the lead frame assembly.
Figure 14:
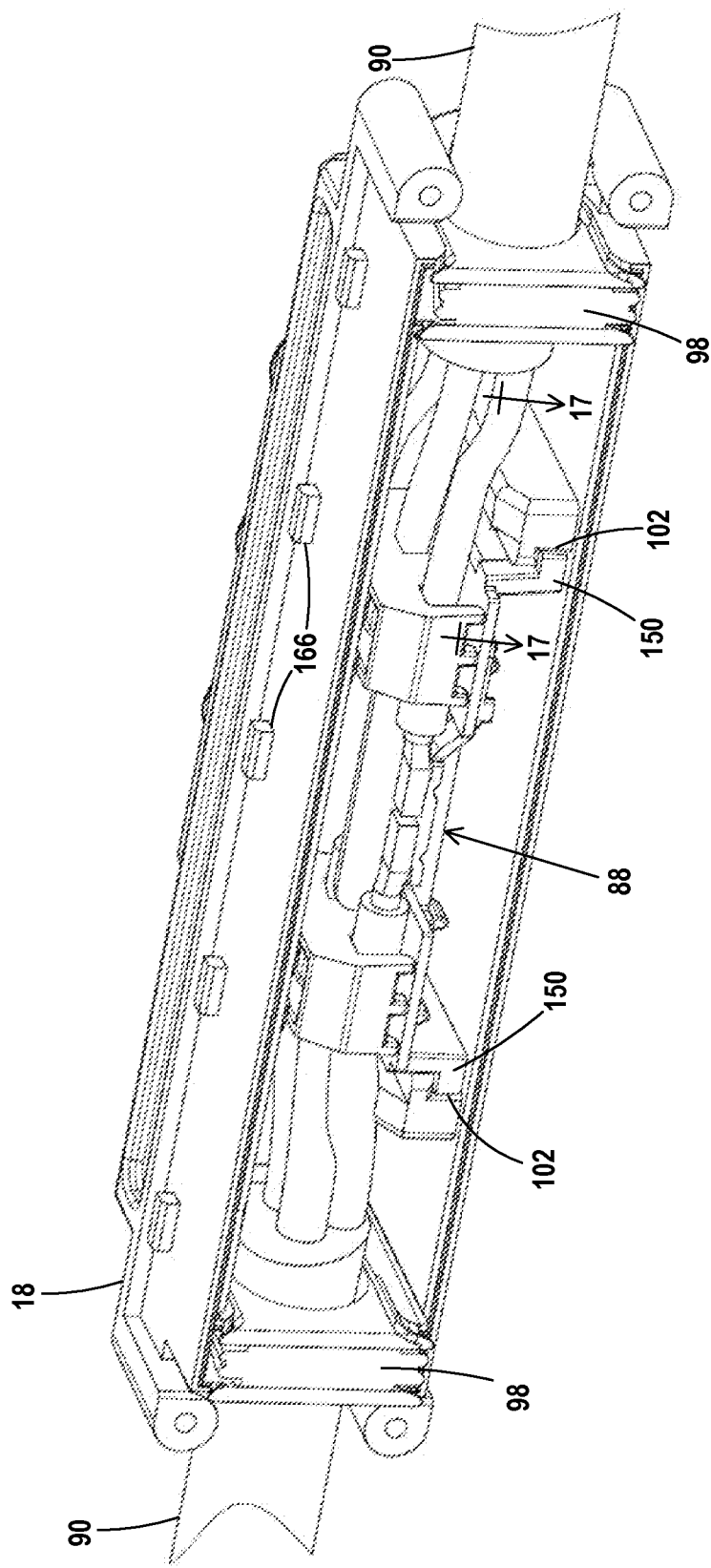
FIGS. 14, 15 and 16 are rear perspective views of the cable connector illustrating assembly.
Figure 15:
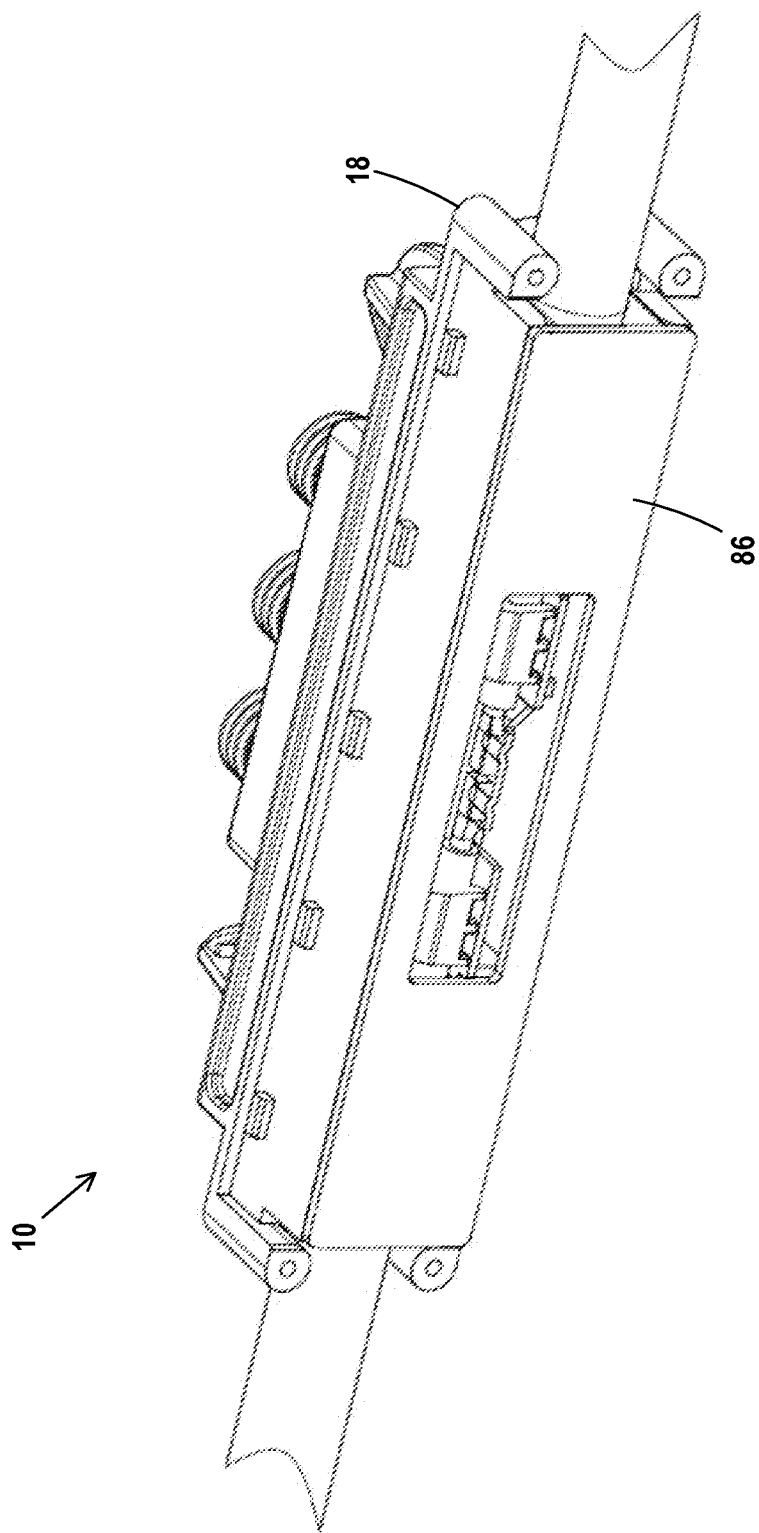
Figure 16:
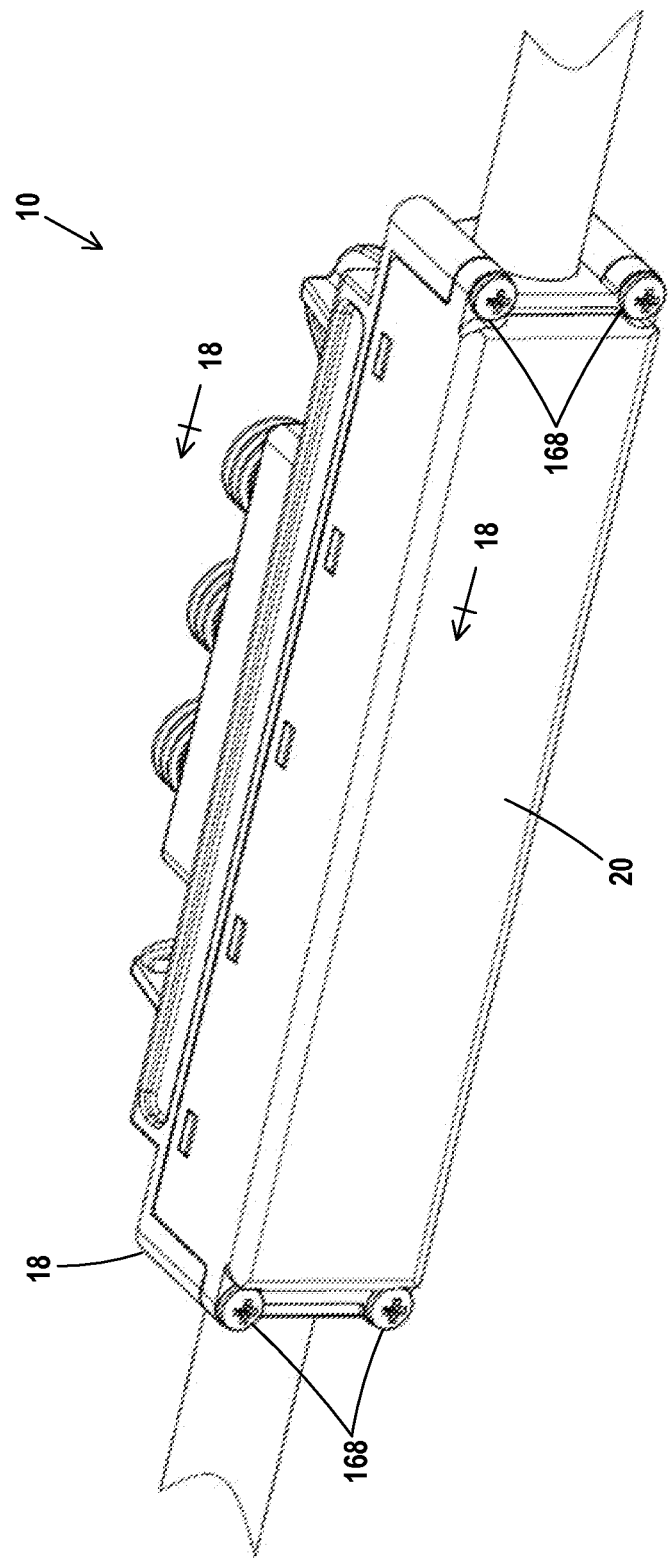

Lead assembly 88 is illustrated in FIGS. 11 and 12 and includes a generally rectangular plastic body or frame 108 having two like and spaced-apart side portions 110 and 112. Side portions 110 and 112 are joined by vertical separation walls 114 and 116 at the rear of the body and by recessed mounting strip 118 at the front of the body. Spaces 120, 122 and 124 separate strip 118 and wall 116, wall 116 and wall 114, and wall 114 and the adjacent side of body 108, respectively.

Formed metal leads 126, 128 and 130 are mounted on one side of body 108. Central lead 126 includes contact pad 132 in space 120, straight run 134 mounted on strip 118 and central contact pins 136 extending outwardly from body 108.

Side lead 128 includes contact pad 138 in space 122, lowered L-shaped run 140 mounted on side portion 112 and outwardly extending contact pin 142 to one side of contact pin 136.

Side lead 130 includes contact pad 144 in space 124, lowered L-shaped run 146 mounted on portion 110 and outwardly extending contact pin 148 located at the same level and in alignment with contact pins 136 and 142 on the other side of contact pin 136.

The metal leads 126, 128 and 130 are secured to body 108 by snap engagement with pins 131 extending from the body, as illustrated in FIG. 12, or may be molded in the body, as desired.

As illustrated in FIG. 12, the L-shaped runs 140 and 146 are located at a level to one side of or below the contact pins 142 and 148 and pads 138 and 144. This offset of the runs permits the runs to cross over wires 92 and 94 while the pads and pins are at the same level.

A pair of spaced mounting projections 150 extend outwardly from the opposed edges of portions 110 and 112 at the bottom of the assembly. Latch arms 152 extend outwardly from portions 110 and 112 above projections 150. See FIGS. 12, 13, 14 and 17.

FIG. 11 illustrates the top of assembly 88. Cable seals 98 are placed on cable ends 90. Insulation on the inner ends of the wires 92, 94 and 96 is stripped away, exposing conductor ends 158. The ends of wires 92, 94 and 96 in the two adjacent end sections 90 of cable 12 are positioned on the top of body 108 away from leads 126, 128 and 130. Two wire holders 154 hold the ends of the wires in place on portions 110 and 112. Each wire holder 154 includes a recess for each wire. The wire holders are latched onto portions 110 and 112 by four latch fingers 156, shown in FIG. 12 to hold the wires in place on assembly 88. The fingers extend through holes in portions 110, 112 and latch against the lower surfaces of the portions.

The conductor end 158 of each wire is welded to a contact pad. The conductor ends for wires 92 are welded to pad 132. The conductor ends for wires 94 are welded to pad 138. The conductor ends for wires 96 are welded to pad 144. The wire ends and pads are positioned in spaces 120, 122 and 124 away from plastic body 108 to provide access for tooling to make the welds without injury to the plastic.

The wires are preferably welded to the contact pads. Other types of metallurgical bonds may be used, including soldering. Separation walls 114 and 116 maintain electrical isolation between the wires and pads. Wire holders 154 secure the wires to body 108. The holders may be attached after bonding the conductor ends to the pads.

Contact pins 136, 142 and 148 are spaced to one side of and along the length of cable 12. Flat central lead 126 extends laterally from the cable directly from pad 132 to contact pin 136.

Lead 128 extends from pad 138 a distance along wire 94, crosses wires 94 and 92 and joins contact pin 142. The L-shaped portion of lead 128 is located on the side of body 108 away from the wires.

Lead 130 extends from pad 144 a distance along wire 96, crosses wires 96, 94 and 92 and joins contact pin 148. The L-shaped portion of lead 130 is located on the side of body 108 away from the wires.

Figure 3:
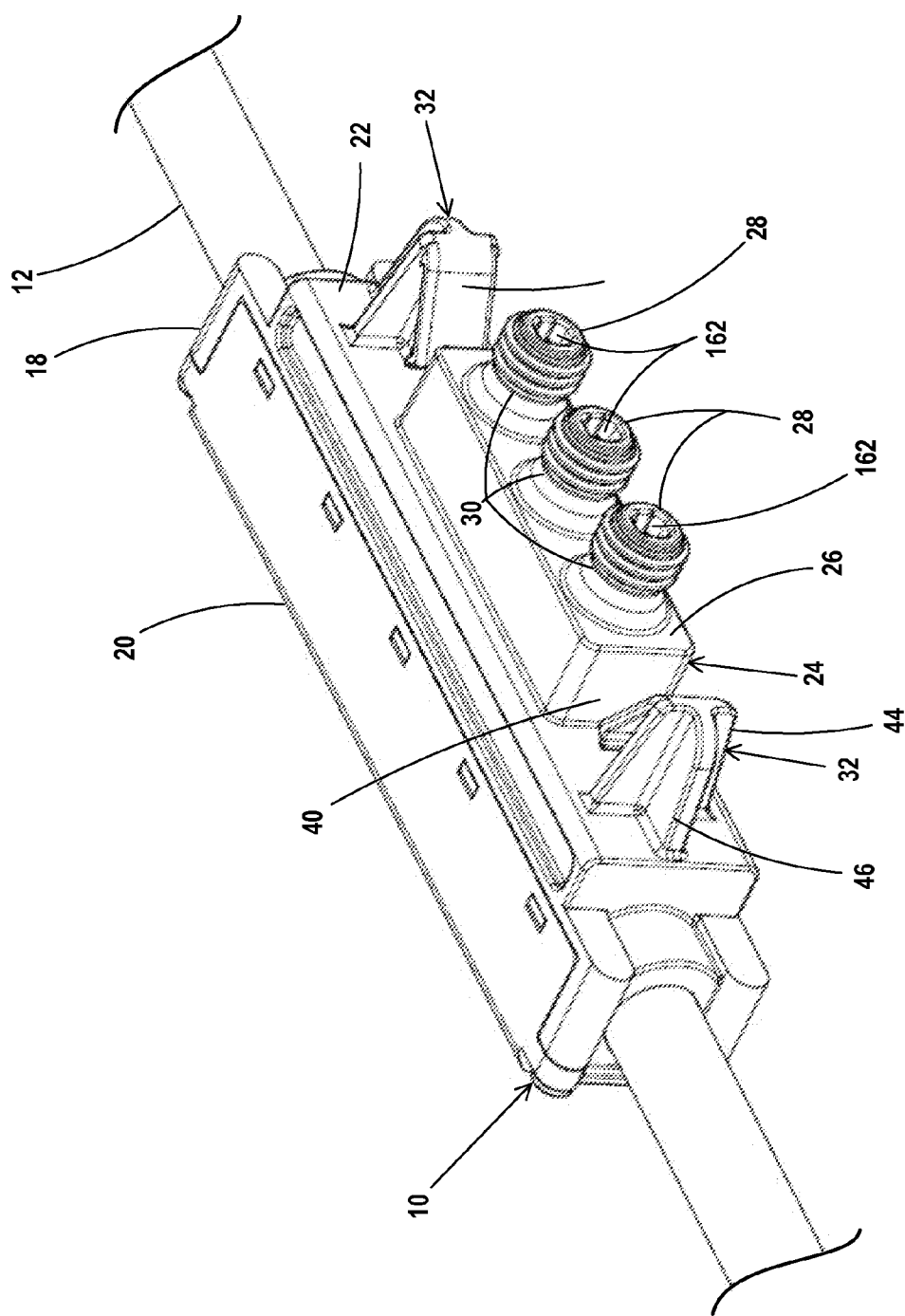
FIG. 3 is a front perspective view of a cable connector of the electrical connector assembly shown in FIG. 2.
Figure 17:
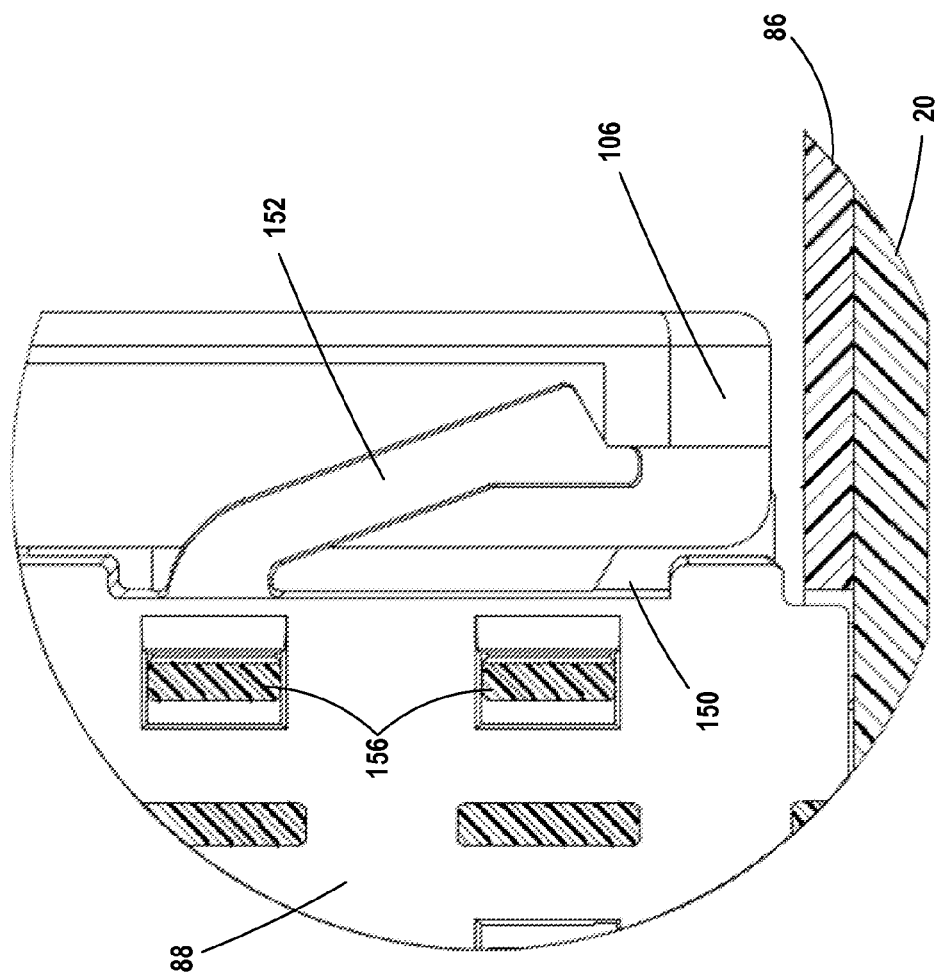
FIG. 17 is a sectional view taken along line 17-17 of FIG. 14.
Figure 18:
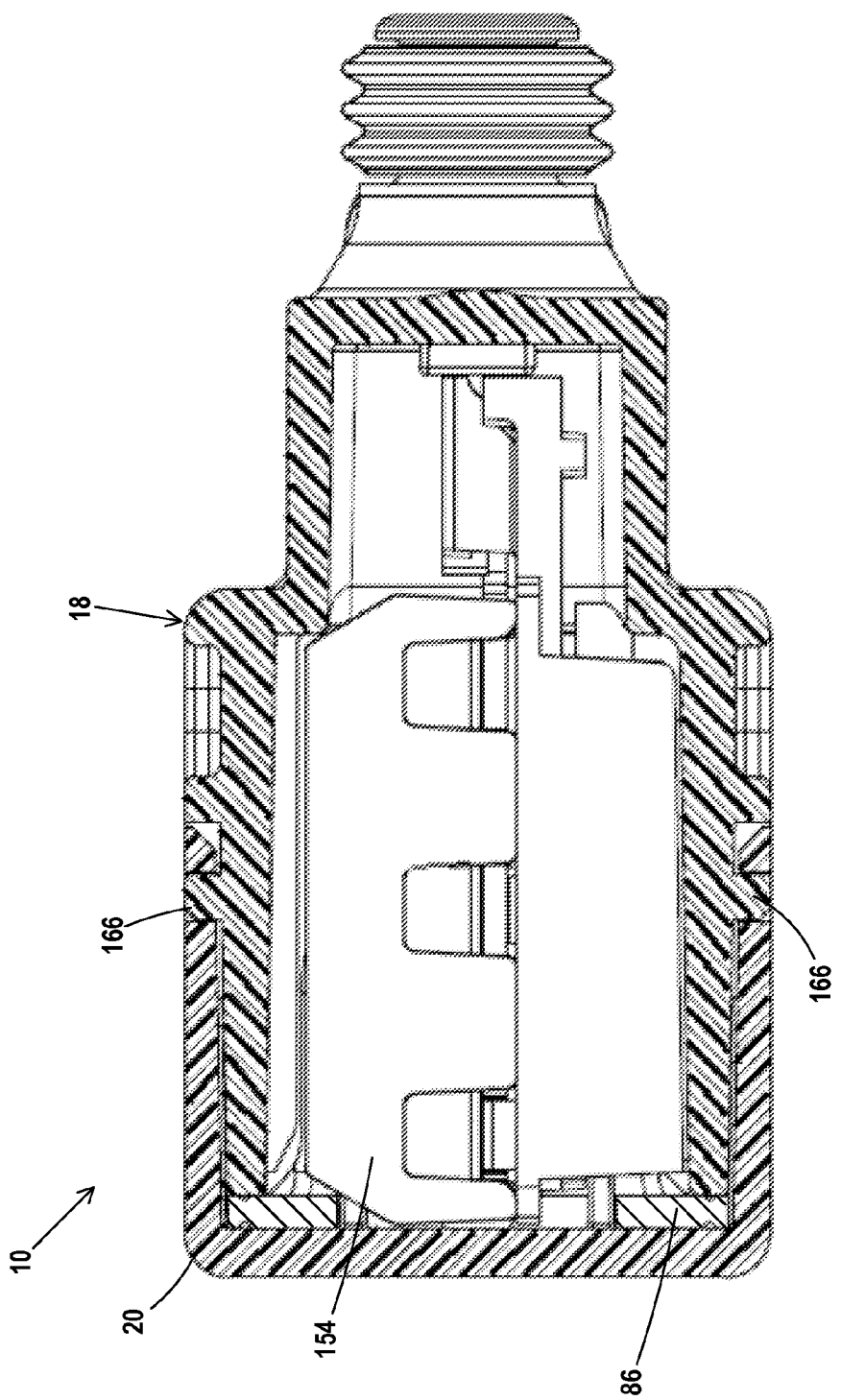
FIG. 18 is a vertical sectional view taken along line 18-18 of FIG. 16.

Connector 10 is assembled by positioning assembly 88 and wire ends 90 adjacent the open back of housing 18 as shown in FIG. 10 and then moving the assembly 88 and wire ends 90 into the housing to extend the pins 136, 142 and 148 through close-fit openings in body 18 and into the interior recesses 162 in contact barrels 28 as shown in FIG. 3. Mounting projections 150 extend into alignment grooves 102 to properly position the frame assembly 88 in housing 18. When the housing is fully inserted, as shown in FIG. 17, latch arms 152 snap behind latch stops 106 to hold the assembly in the housing. The entire assembly is fitted in the housing. Cable seals 98 are fitted in recesses 100 at the ends of the housing.

After the assembly and cable seals have been fitted in housing 18, liquid urethane potting material is flowed into the interior of the housing to surround the assembly and wires in the housing. Sealing gasket 86 is placed over the open end of the filled housing and cover 20 is latched onto the housing with edge latches 164 on the interior surfaces of the top and bottom walls of the cover engaging latch projections 166 on the top and bottom of the housing. Screws 168 secure the corners of the cover to the housing. The gasket 86 overlies the flat sides of cable seals 98 to form a flow-tight seal when the cover is latched and screwed onto the housing. See FIG. 4.

A number of electrical connectors 10 are mounted on cable at appropriate locations for forming electrical connections with panels 16 in a solar panel field or array. Each connector is mounted on the connector socket 52 for the DC-to-AC inverter on the panel by aligning the connector 10 with socket 52 and then extending the three barrels 28 into central recess 56 in alignment with cylindrical openings 60. The guide ribs 62 center the barrels vertically in the opening and position the barrels vertically for extension into the openings. Guide surfaces 44 help align connector 10 horizontally.

The contact pins 136, 142 and 148 in the barrels 28 extend into and form electrical connections with the three output contacts 84 in openings 60 in socket 52. Sealing gaskets 30 are compressed as the barrels move into openings 60 and form environmental seals for preventing moisture or gases from flowing into the interior of inverter 14. Latch recesses 58 do not open into the interior of the inverter. Contacts 84 form electrical connections with the contact pins to connect the three-phase AC output from inverter 14 to the three wires in cable 12.

The three spaced barrels 28 with surrounding three rib sealing gaskets 30 form tight, high-friction connections between connector 10 and socket 52. These connections and latches 32 hold the socket and body together. The equally spaced-apart barrels 28 and openings 60 permit connector 10 to be plugged into socket 52 in a first position or in a second position rotating 180° from the first position. Each latch member 32 may be latched into either latch recess 58.

Movement of connector 10 into socket 52 extends latch members 32 into latch recesses 58. The rounded ends of the members facilitate piloting into the recesses. As the members are moved into the recesses, latch arms 38 engage projections 65 on the outer ends of walls 64 and are flexed inwardly, away from walls 64 as members 32 are moved into recesses 58. The distance between the narrow rib and the projection at the mouth of each recess is greater than the thickness of the latch finger. This permits insertion of the latches into the latch recesses. Ribs 50 prevent over-flexing. When socket 52 is fully inserted into connector 10, as illustrated in FIG. 9, latch arms 38 pass projections 65 and snap back against surfaces 66 on the projections to latch the connector to the socket.

In order to unlatch socket 52 from connector 10, tool 70 is positioned above the socket with release fingers 76 above openings 68. The tool is then moved down to extend the fingers into openings 68 so that the surfaces 78 facing the connector 10 engage arms 38 and flex the arms toward ribs 50 and out of engagement with latch surfaces 42. With the latches disengaged, an operator may pull connector 10 from socket 52. During disengagement, the ends of arms 38 slide along the fingers and out from recesses 58. The sides of the fingers away from the walls 64 are inside projections 65. Walls 64 support release fingers 76 during unlatching.

What we claim as our invention is:

1. An electrical connector assembly comprising first and second connector members, the first connecting member including a first molded plastic body and a plurality of first electrical contacts on the first body, the second connecting member including a second molded plastic body and a plurality of second electrical contacts on the second body, individual pairs of said first and second electrical contacts engaging each other when the two connector members are engaged, the first body including a latch member, the latch member having an arm support extending toward the second body, the arm support having an outer end spaced from the first body and a flexible arm extending from the outer end inwardly toward the first body to a free end, a first rib, a second rib perpendicular to the first rib on the side of the support away from the arm, and a narrow rib on the side of the support adjacent the arm so that the arm support has a generally x-shape, said latch arm joined to said first rib at the outer end of the arm support; and the second connector member defining a latch recess having a mouth, an inwardly extending projection at the mouth and a latch surface facing away from the mouth, the latch recess in alignment with the latch member, whereby during movement of the first and second connector members together to form electrical connections between pairs of said first and second contacts, the latch member is moved into the recess, the latch arm engages and rides over the projection and snaps back in the recess with the free end of the arm in latch engagement with the latch surface to hold the connector members together and the narrow rib prevents over-flexing of the arm.

2. The assembly as in claim 1 wherein the distance between the narrow rib and the projection at the mouth of the recess is greater than the thickness of the finger.

3. The assembly as in claim 1 including a latch release opening in the second body located over the arm wherein a release member may be inserted through the opening to engage the arm and flex the arm away from the projection.

4. The assembly as in claim 1 wherein the outer end of the projection is rounded.

5. The assembly as in claim 1 wherein the first connecting member body includes a projection to one side of the latch member and said first terminals extend outwardly from the projection, the second connecting member body includes a projection recess adjacent the latch recess and said second contacts are located adjacent said projection recess, wherein when the first and second members are engaged, the projection is seated in the projection recess, and the first and second terminals engage each other.

6. The assembly as in claim 5 wherein said projection recess in the second body includes guide ribs to facilitate engagement between the first and second members.

7. The assembly as in claim 1 including a circuit board in the second body, a right-angle header on the circuit board, the right-angle header including said second contacts, said second contacts each located in an opening in the second body opening into the projection recess; and alignment means between the second body and the right-angle header for positioning the second contacts in the second body for engagement with the first contacts.

8. The assembly as in claim 7 wherein said means comprises a rib and groove connection between the right-angle header and the second body.

9. The assembly as in claim 8 comprising a rib on the second body and a groove on the right-angle header.

10. An electrical connector assembly for forming electrical connections between an inverter on a solar panel and conductors in a power cable, the assembly comprising a electrical connector on the cable and a connector socket on the inverter; the electrical connector including a first molded plastic body having a front face, a rectangular projection extending outwardly from the front face and a first plurality of electrical contacts on the projection, and a pair of latch members, each latch member extending outwardly from the front face adjacent the projection, said projection located between said latch members, each latch member having an arm support with a free end above the front face and a flexible, reverse bend latch arm extending inwardly from the free end toward the face; the connector socket including a second molded plastic body having two spaced latch recesses and a central recess between the latch recesses, an inwardly extending projection on the mouth of each recess, a plurality of second electrical contacts in the second recess, wherein moving the cable connector toward the connector socket seats the projection in the rectangular recess, forms electrical connections between the first and second contacts and extends the latch members into the latch recesses for latched engagement of the latch arms with the projections.

11. The electrical connector assembly as in claim 10 including a wall at each end of the projection recess separating the projection recess from the adjacent latch recess, said projections on said walls.

12. The electrical connector assembly as in claim 11 including a latch release opening extending through the second body at each latch recess.

13. The electrical connector assembly as in claim 10 wherein the second body includes a plurality of openings in the bottom of the projection recess, said second terminals in said openings, said first terminals extending outwardly from said projection for engaging said second terminals.

14. The electrical connector assembly as in claim 10 wherein said latch arms are adjacent the projection.

15. The electrical connector assembly as in claim 10 wherein said arm supports each include a rib under the latch arm, said rib preventing over-flexing of the latch arm.

16. The electrical connector assembly as in claim 10 wherein said arm supports are x-shaped and include a flat rib having an outer end, the inner end of the latch arm joined to such outer end, a perpendicular rib extending away from the flat arm on the side of the arm away from the latch arm, and a narrow rib extending perpendicularly away from the flat rib under the latch arm.

* * * * *